US011527468B2

(12) United States Patent
Riegler et al.

(10) Patent No.: US 11,527,468 B2
(45) Date of Patent: Dec. 13, 2022

(54) SEMICONDUCTOR OXIDE OR GLASS BASED CONNECTION BODY WITH WIRING STRUCTURE

(71) Applicant: Infineon Technologies AG, Neubiberg (DE)

(72) Inventors: Andreas Riegler, Lichtpold (AT); Christian Fachmann, Fuernitz (AT); Matteo-Alessandro Kutschak, Ludmannsdorf (AT); Carsten von Koblinski, Villach (AT); Hans Weber, Bayerisch Gmain (DE)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 16/568,818

(22) Filed: Sep. 12, 2019

(65) Prior Publication Data

US 2020/0091058 A1    Mar. 19, 2020

(30) Foreign Application Priority Data

Sep. 14, 2018  (DE) .......................... 102018122515.6

(51) Int. Cl.
*H01L 23/498* (2006.01)
*H01L 23/15* (2006.01)
(Continued)

(52) U.S. Cl.
CPC .... *H01L 23/49838* (2013.01); *H01L 21/4846* (2013.01); *H01L 23/13* (2013.01);
(Continued)

(58) Field of Classification Search
CPC . H01L 23/15; H01L 23/49844; H01L 23/057; H01L 23/49838; H01L 23/13;
(Continued)

(56) References Cited

U.S. PATENT DOCUMENTS

| 6,071,809 A | 6/2000 | Zhao |
| 2002/0050776 A1* | 5/2002 | Kubota ................... H01J 9/025 445/24 |

(Continued)

FOREIGN PATENT DOCUMENTS

| DE | 102013106299 A1 | 12/2013 |
| DE | 102013113061 A1 | 5/2014 |

(Continued)

*Primary Examiner* — Vongsavanh Sengdara
(74) *Attorney, Agent, or Firm* — Murphy, Bilak & Homiller, PLLC

(57) ABSTRACT

A connection body which comprises a base structure at least predominantly made of a semiconductor oxide material or glass material, and an electrically conductive wiring structure on and/or in the base structure, wherein the electrically conductive wiring structure comprises at least one vertical wiring section with a first lateral dimension on and/or in the base structure and at least one lateral wiring section connected with the at least one vertical wiring section, wherein the at least one lateral wiring section has a second lateral dimension on and/or in the base structure, which is different to the first lateral dimension.

19 Claims, 8 Drawing Sheets

(51) Int. Cl.
  *H01L 23/00* (2006.01)
  *H01L 23/13* (2006.01)
  *H01L 21/48* (2006.01)

(52) U.S. Cl.
  CPC .............. *H01L 23/15* (2013.01); *H01L 24/08* (2013.01); *H01L 24/89* (2013.01); *H01L 24/97* (2013.01); *H01L 2224/08237* (2013.01); *H01L 2224/80001* (2013.01)

(58) Field of Classification Search
  CPC ......... H01L 24/97; H01L 24/24; H01L 24/89; H01L 24/82; H01L 24/08; H01L 21/4846; H01L 2224/80001; H01L 2224/08237
  See application file for complete search history.

(56) References Cited

U.S. PATENT DOCUMENTS

| | | | | |
|---|---|---|---|---|
| 2003/0134455 A1* | 7/2003 | Cheng | ............... | H01L 23/49822 438/106 |
| 2004/0036154 A1* | 2/2004 | Ho | ............... | H01L 23/24 257/E23.101 |
| 2004/0203194 A1* | 10/2004 | Hamasaki | ............... | H01L 21/565 257/E23.092 |
| 2005/0161833 A1 | 7/2005 | Takeuchi et al. | | |
| 2007/0023608 A1* | 2/2007 | Webster | ............ | H01L 27/14618 257/E31.117 |
| 2007/0108561 A1* | 5/2007 | Webster | ............ | H01L 27/14618 257/666 |
| 2009/0290054 A1* | 11/2009 | Shimizu | .................. | H01L 24/97 257/E21.705 |
| 2013/0032905 A1* | 2/2013 | Lo | ........................... | B81B 7/007 257/E21.599 |
| 2013/0174417 A1 | 7/2013 | Yu et al. | | |
| 2013/0334712 A1* | 12/2013 | Meyer-Berg | .......... | H01L 21/561 438/107 |
| 2015/0243590 A1 | 8/2015 | Liu et al. | | |
| 2015/0344296 A1* | 12/2015 | Pahl | ....................... | B81B 7/0061 438/51 |
| 2016/0126228 A1* | 5/2016 | Hsieh | ....................... | H01L 24/82 257/676 |
| 2017/0148761 A1 | 5/2017 | Ma et al. | | |
| 2017/0148955 A1 | 5/2017 | Wu | | |
| 2017/0179078 A1* | 6/2017 | Jung | .................... | H01L 25/0652 |
| 2018/0190531 A1 | 7/2018 | Shih et al. | | |
| 2018/0337160 A1* | 11/2018 | Drab | ....................... | H01L 24/92 |
| 2019/0006307 A1 | 1/2019 | Qiu et al. | | |

FOREIGN PATENT DOCUMENTS

| | | |
|---|---|---|
| WO | 2017124670 A1 | 7/2017 |
| WO | 2018094168 A1 | 5/2018 |

\* cited by examiner

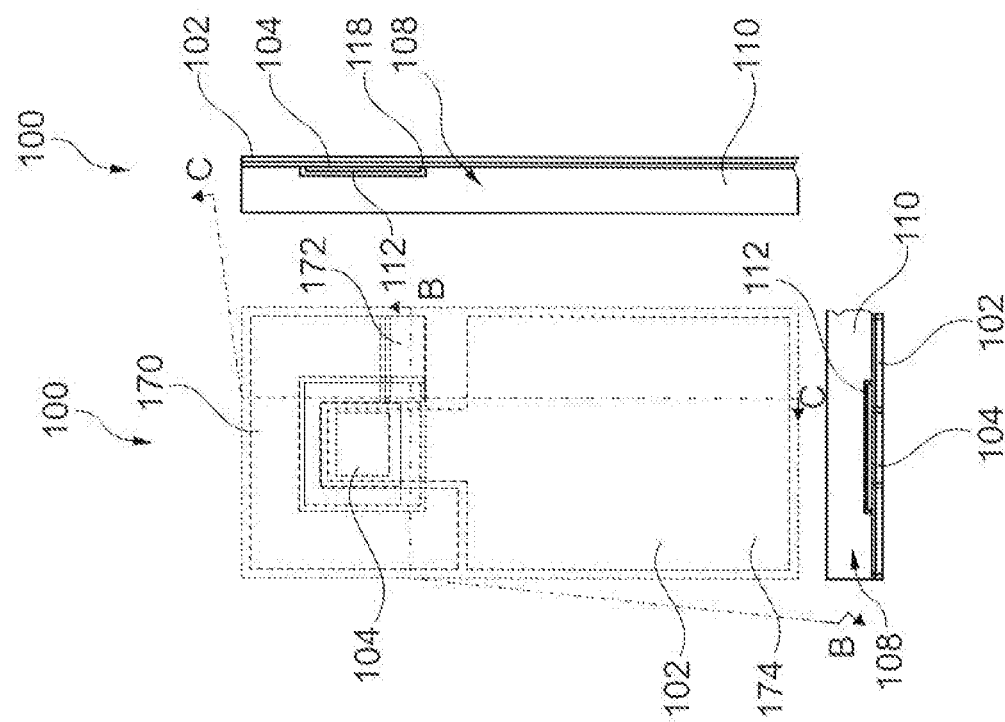
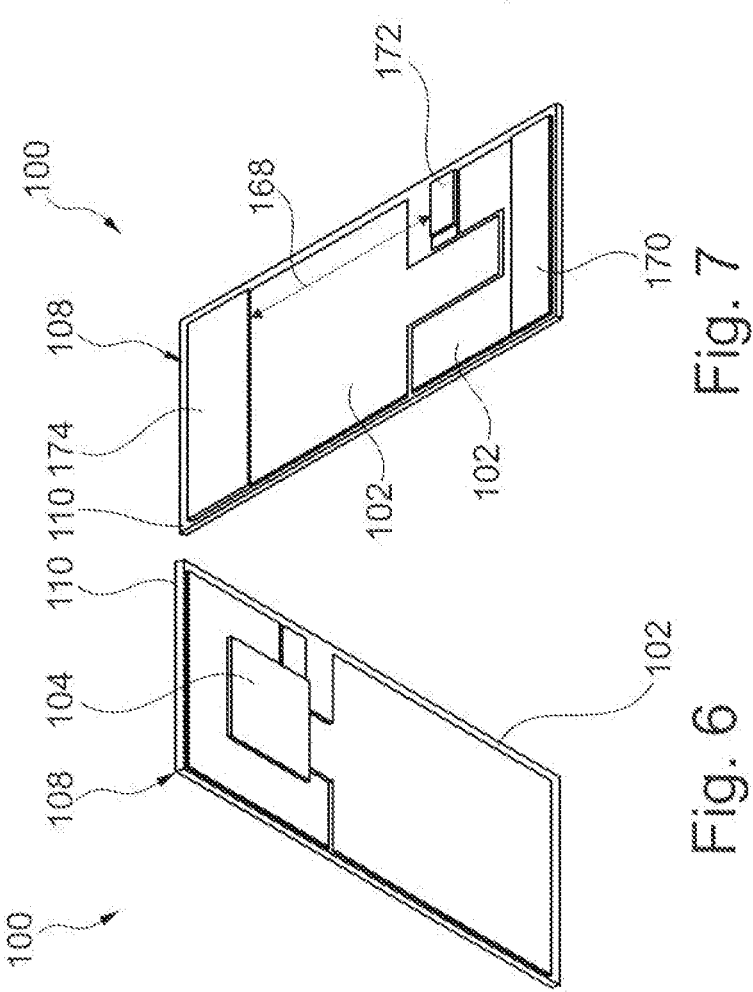
Fig. 8
Fig. 7
Fig. 6

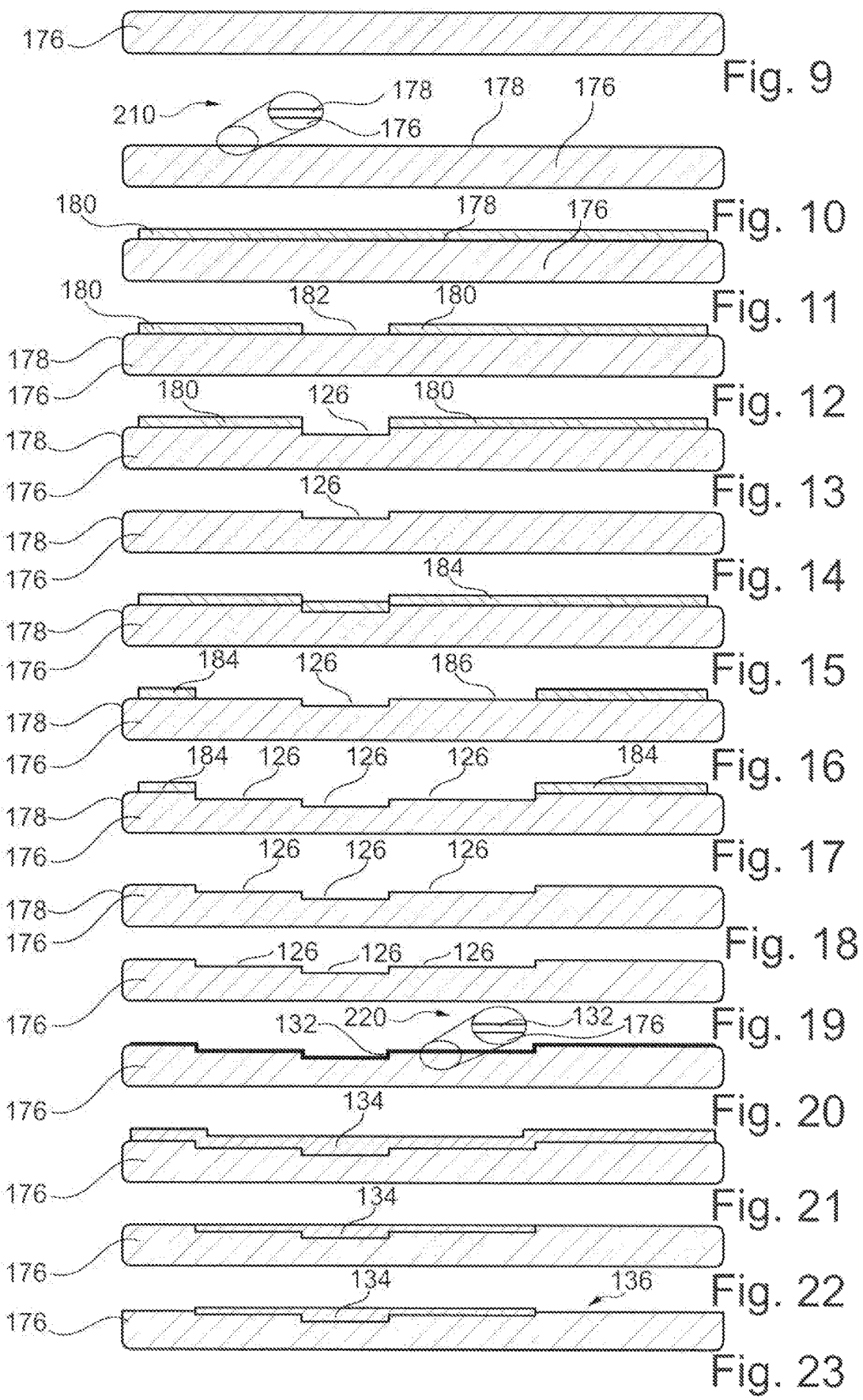

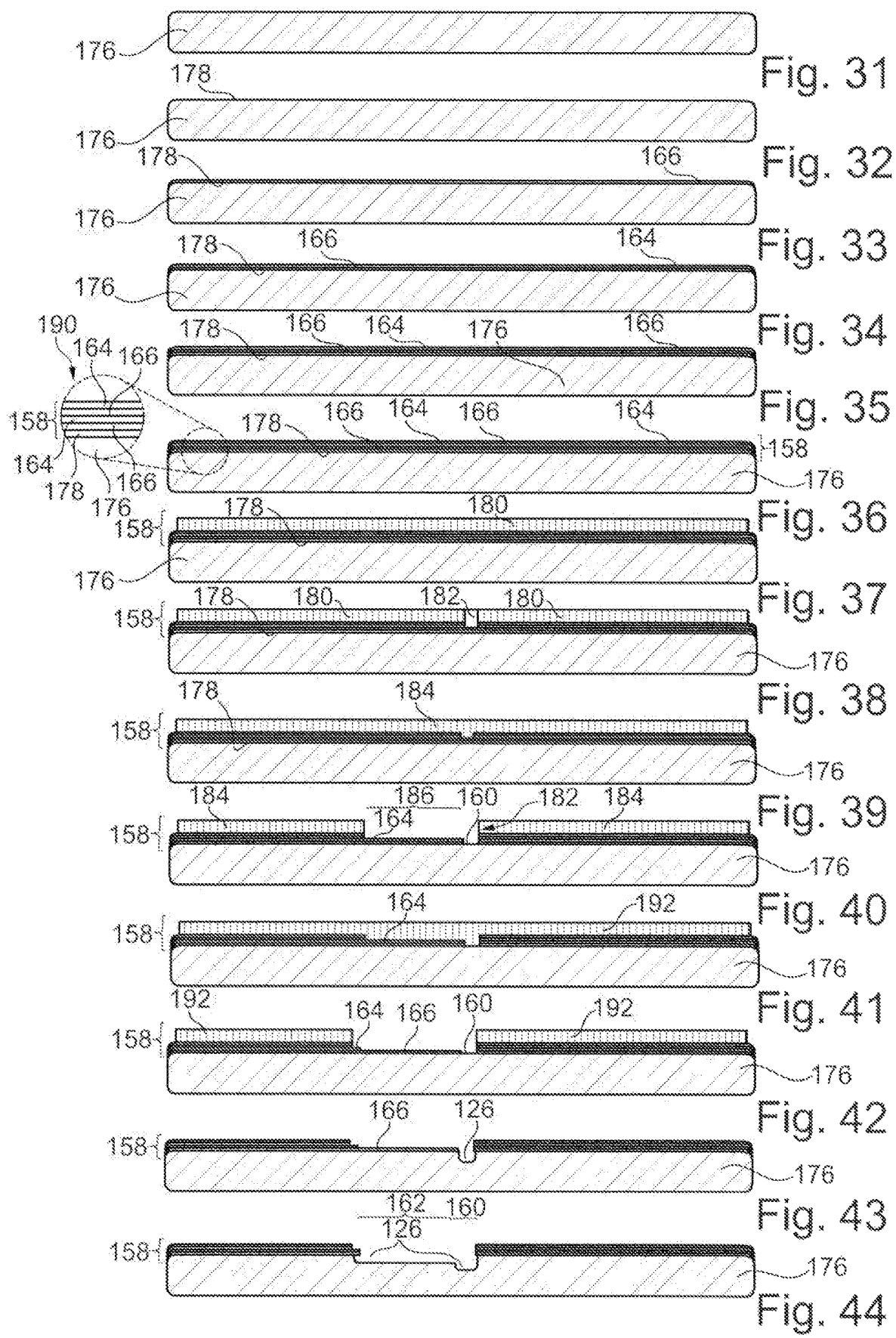

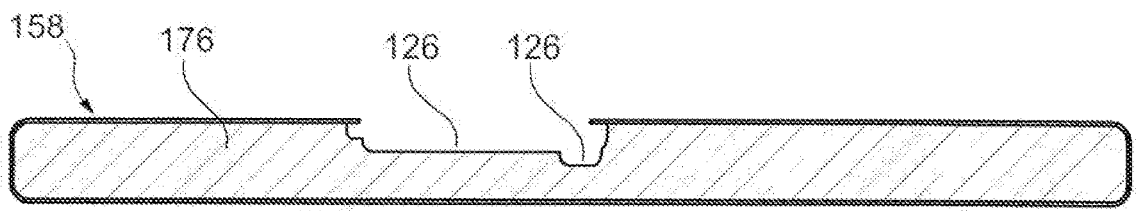
Fig. 45
Fig. 46
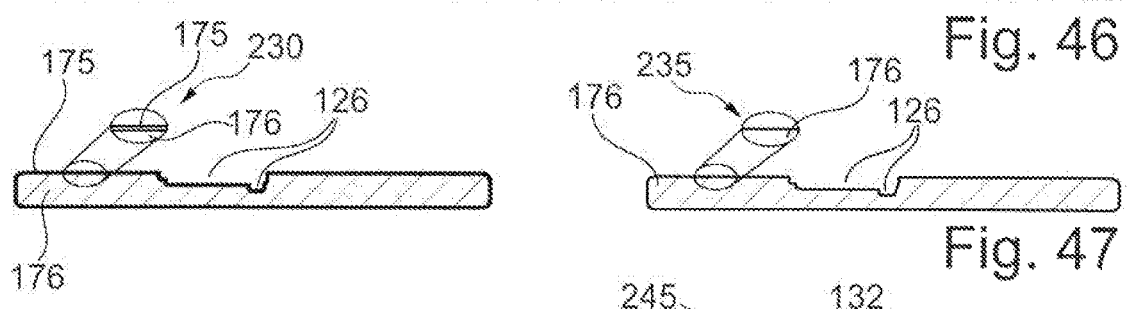
Fig. 47
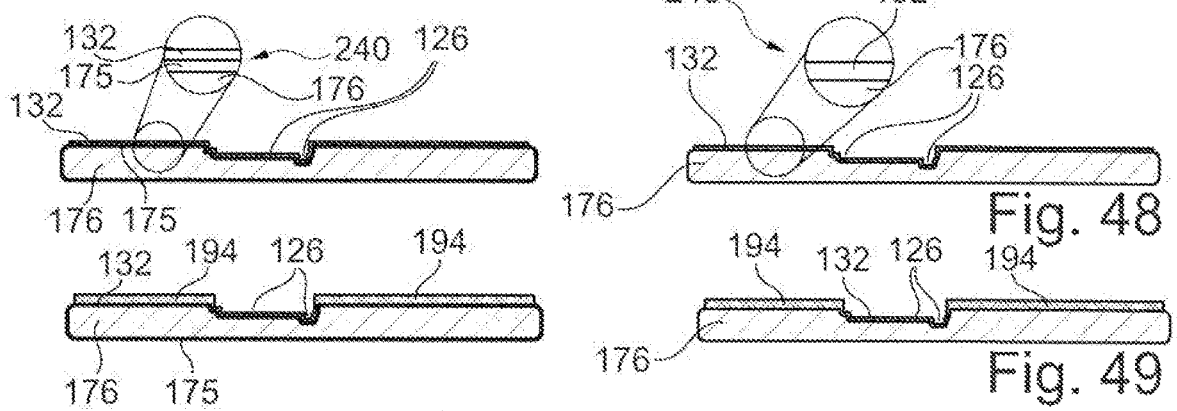
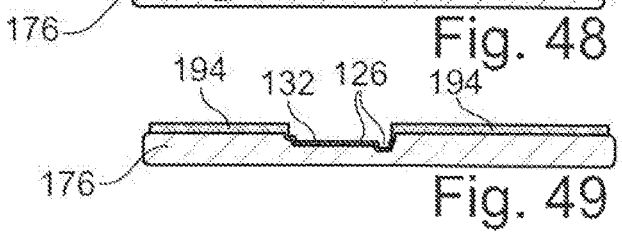
Fig. 48
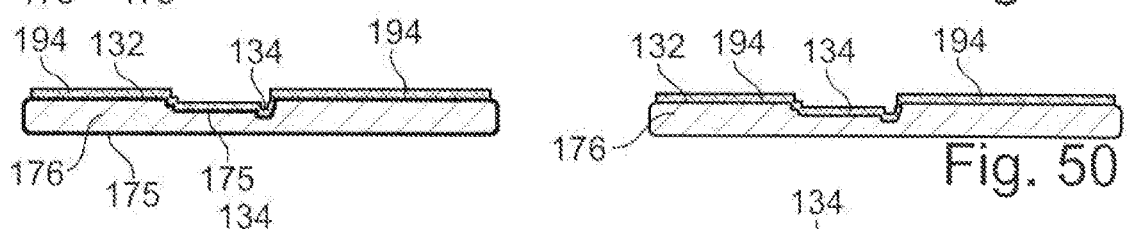
Fig. 49
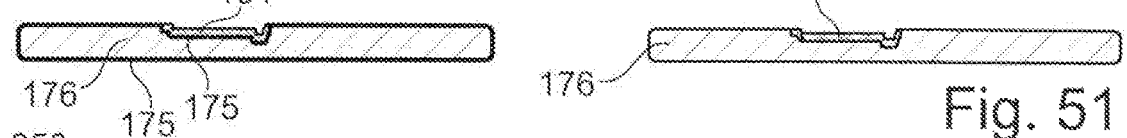
Fig. 50
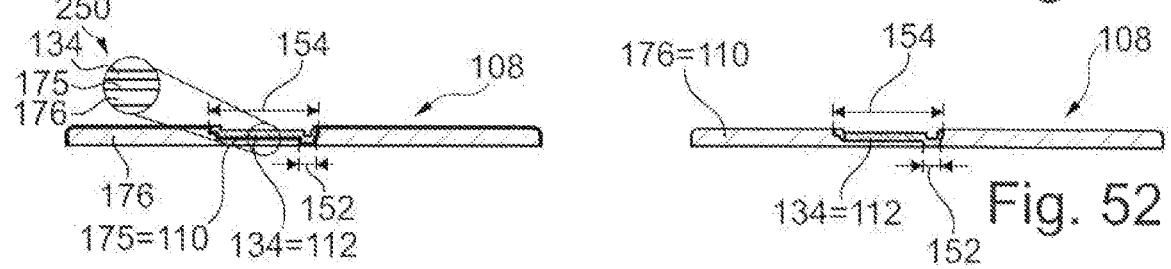
Fig. 51
Fig. 52

SEMICONDUCTOR OXIDE OR GLASS BASED CONNECTION BODY WITH WIRING STRUCTURE

TECHNICAL FIELD

The present invention relates to a connection body, to a package and to a method of manufacturing a connection body.

BACKGROUND

A package, for instance for automotive applications, provides a physical containment for one or more electronic chips comprising one or more integrated circuit elements. Examples of integrated circuit elements of packages are a field effect transistor, an insulated-gate bipolar transistor (IGBT), a diode, and passive components (such as an inductance, a capacity, a resistor). Moreover, such packages may be used for producing a system-in-package.

For manufacturing a package, an electronic chip may be mounted on a chip carrier (such as a leadframe). Subsequently, a chip pad may be connected with the chip carrier by wire bonding. The at least one electronic chip may then be encapsulated by an appropriate encapsulant.

However, there is still potentially room to improve reliability of a chip package, in particular in terms of the mechanical integrity of the package. Also miniaturization of packages and a simple manufacturing method are desired. Last but not least, an efficient wiring architecture of a package is desirable.

SUMMARY

There may be a need for an efficient wiring architecture for an electronic chip which is compact and simple in manufacture.

According to an exemplary embodiment, a connection body is provided which comprises a base structure at least predominantly made of a semiconductor oxide material or glass, and an electrically conductive wiring structure on and/or in the base structure, wherein the electrically conductive wiring structure comprises at least one vertical wiring section with a first lateral dimension on and/or in the base structure and at least one lateral wiring section connected with the at least one vertical wiring section, wherein the at least one lateral wiring section has a second lateral dimension on and/or in the base structure, which is different to (in particular larger than) the first lateral dimension.

According to another exemplary embodiment, a package is provided which comprises an electronic chip having at least one pad (in particular exactly one pad or a plurality of pads), and a connection body comprising a base structure at least predominantly made of a semiconductor oxide material or glass and an electrically conductive wiring structure at least partially on and/or in the base structure, wherein the electrically conductive wiring structure of the connection body is connected to the at least one pad of the electronic chip.

According to another exemplary embodiment, a method of manufacturing a connection body is provided, wherein the method comprises providing a base structure at least predominantly made of a semiconductor oxide material or glass material, and forming an electrically conductive wiring structure on and/or in the base structure, wherein the electrically conductive wiring structure is formed with at least one vertical wiring section extending vertically through at least part of the connection body (in particular of the base structure) and with at least one lateral wiring section connected with the at least one vertical wiring section and extending laterally in the connection body (in particular in the base structure).

According to an exemplary embodiment, a connection body and a package are provided with a semiconductor oxide or glass based base structure with an electrically conductive wiring formed therein with an extension both in a lateral and in a vertical direction so that in particular at least one edge may be formed at an interface between a lateral wiring section and an adjacent vertical wiring section. By taking this measure, a cheap semiconductor oxide/glass base structure may be used for forming an electrically conductive wiring in an interior thereof. The latter may serve for contacting at least one electronic chip when the latter is mounted on the connection body. By taking this measure, the wiring connection of one or more electronic chips to be packaged may be formed in a very simple and compact way with very small effort and by carrying out a simple manufacturing process. Furthermore, the described packaging procedure of the electronic chip is highly appropriate for parallel processing in a batch manufacturing architecture, i.e. for forming multiple chip packages at the same time. Descriptively speaking, many processes of such a manufacturing procedure can be carried out on "wafer" level when the connection body is dimensioned so as to electrically connect (and optionally additionally also to mechanically carry) multiple electronic chips of different packages before singularization into individual packages.

In the following, further exemplary embodiments of the connection body, the package and the method will be explained.

In the context of the present application, the term "package" may particularly denote at least one electronic chip coupled with a wiring structure as at least one external electric contact. Such a package may further comprise a dielectric protection structure for protecting and insulating the chip (which may be accomplished in exemplary embodiments by the base structure), and optionally an electrically conductive carrier on which the chip may be mounted.

In the context of the present application, the term "electronic chip" may particularly denote a chip (more particularly a semiconductor chip) providing an electronic function. The electronic chip may be an active electronic component. In one embodiment, the electronic chip is configured as a controller chip, a processor chip, a memory chip, a sensor chip or a micro-electromechanical system (MEMS). In an alternative embodiment, it is also possible that the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc. The electronic chip may be a naked chip or may be already packaged or encapsulated. However, the electronic chip may also be a passive component such a capacitor or a resistor. A chip may also be denoted as die.

In the context of the present application, the term "carrier" may particularly denote an at least partially electrically conductive structure which serves simultaneously as a mounting base for one or more electronic chips and also contributes to the electric connection of the electronic chip(s) with an electronic environment of the package. In other words, the chip carrier may fulfil a mechanical support function and an electric connection function. A preferred embodiment of a carrier is a leadframe.

In the context of the present application, the term "glass" may particularly denote a non-crystalline amorphous solid comprising a significant amount of silicon dioxide (SiO2), i.e. silica. Silica may be the main component of glass. In particular, the term glass covers silicate glasses which are based on the chemical compound silica (silicon dioxide, or quartz). Of the many silica-based glasses that can be used, one example is a composition of approximately 75% silicon dioxide (SiO2), additionally sodium oxide (Na2O) and calcium oxide (CaO), and several minor additives. It is also possible that the glass is made of pure silica (SiO2), as in case of fused quartz. In particular, at least 80 weight percent, in particular at least 95 weight percent of the base structure of the connection body may be glass.

In the context of the present application, the term "semiconductor oxide" may particularly denote a chemical compound comprising a semiconductor material as first constituent and oxygen as further constituent. An example of a semiconductor oxide is silicon oxide (in particular silicon dioxide). Another example of a semiconductor oxide is germanium oxide (in particular germanium dioxide).

In the context of the present application, the term a base structure "at least predominantly made" of glass or semiconductor oxide may particularly denote that the main constituent or major component of the base structure may be glass material or semiconductor oxide material. In particular, the weight percentage of glass or semiconductor oxide of a base structure at least predominantly made of glass or semiconductor oxide may be at least 60 weight percent, in particular at least 70 weight percent, more particularly at least 90 weight percent. It is also possible that the base structure consists only of glass or semiconductor oxide.

In the context of the present application, the term "vertical wiring section" may particularly denote an electrically conductive section of the wiring structure extending along the thickness direction of the (in particular plate shaped) connection body. The connection body may have a dimension in its thickness direction of less than 50%, in particular of less than 20%, compared to its dimensions perpendicular to the thickness direction (i.e. compared to its dimensions in a plane corresponding to or parallel to two opposing main surfaces of the connection body.

In the context of the present application, the term "lateral wiring section" may particularly denote an electrically conductive section of the wiring structure extending perpendicular to the thickness direction of the (in particular plate shaped) connection body. A lateral or horizontal wiring structure may extend parallel to opposing main surfaces of the (in particular plate shaped) connection body.

A gist of an exemplary embodiment is the provision of a method for forming a semiconductor device or package. In such an embodiment, one or more electronic chips may be optionally arranged on a carrier such as a leadframe. Additionally, a wiring (or rewiring) structure may be formed in a base structure having glass or a semiconductor oxide material as main constituent (in particular a glass substrate, a semiconductor oxide substrate or a semiconductor oxide layer on a support body made of another material). In a further procedure, the base structure with the wiring structure formed therein (which may be denoted altogether as connection body) may be attached to the carrier (if present) such that the wiring structure electrically contacts the one or more electronic chips. In an embodiment in which no carrier is present, the one or more electronic chips may be directly mounted on the wiring structure of the connection body. The latter then also serves for carrying or holding the one or more electronic chips, in addition to its electric connection function.

In an embodiment, the base structure is made substantially of glass. In particular, at least 90 weight percent of the base structure, more particularly the entire base structure, may consist of glass. Thus, a simple glass body may be processed (in particular by etching) for forming wiring structures therein.

In another embodiment, the base structure may be made substantially of silicon dioxide (SiO2). In particular, at least 90 weight percent of the base structure, more particularly the entire base structure, may consist of silicon dioxide.

In yet another embodiment, it is also possible to form a base structure by covering a support body (in particular a silicon body) in a surface portion with a silicon dioxide surface layer (or a glass layer). This may be accomplished, for instance, by surface oxidation (for instance of silicon material), by material deposition, or by attachment of a previously separate base structure (for instance a thin glass plate) on the support body. The surface layer may then form the base structure in which the electrically conductive wiring structure is formed. For instance, the base structure may be substantially made of silicon dioxide which is present only in a surface region of a (in particular silicon) wafer. A main portion of the wafer may then constitute the support body and may hence serve as mechanical support, while the silicon oxide coverage constitutes the base structure and serves for forming the wiring structure therein.

For instance, a silicon wafer, as support body, being covered with silicon oxide, as base structure, may form part of a connection body.

In an embodiment, the electrically conductive wiring structure extends (in particular only) through a subportion of the thickness of the base structure without extending through the entire thickness of the base structure. In other words, a blind hole (in particular with complex shape having vertical as well as lateral sections) may be formed in the base structure and may be filled with electrically conductive material to thereby form the wiring structure. For example, such a connection body may be used as a substitute for bond wires, bond ribbons or clips used conventionally for contacting a chip pad with a chip carrier such as a leadframe. In the described embodiment, this connection task may be accomplished by a wiring structure in a base structure which wiring structure does not extend through the entire thickness of the base structure (compare for instance FIG. 4, FIG. 5 and FIG. 53).

In another embodiment, the electrically conductive wiring structure extends through the entire base structure. In such an embodiment, it is for instance possible that the electrically conductive wiring constitutes a redistribution structure which translates, in terms of electrically conductive connection surfaces, between a small chip size and a larger size of a mounting base (for instance a printed circuit board) on which the connection body or package may be mounted. In such embodiments, the electronic chip may be mounted on one side of the connection body with one or more chip pads which can be connected to the opposing other side of the connection body by the wiring structure extending along the whole path between two opposing main surfaces of the base structure. At this opposing other side, a connection to a mounting base may be made.

In an embodiment, a lateral dimension of the electrically conductive wiring structure on one side of the base structure is different to a lateral dimension of the electrically conductive wiring structure remote to the one side of the base structure. More specifically, the electrically conductive wiring structure may spatially increase a dimension (such as a pitch) of the electrically conductive wiring structure on one side of the base structure to a larger dimension (such as a larger pitch) of the electrically conductive wiring structure on an opposing other side of the base structure. Thus, the electrically conductive wiring structure may serve as a redistribution layer. More specifically, the electrically conductive wiring structure may function as an electrically conductive transfer structure serving as an interface between small chip dimensions and larger dimensions of printed circuit board or the like.

In an embodiment, the electrically conductive wiring structure is configured so that at least one edge is formed in an interior of the base structure between one of the at least one vertical wiring section and a connected one of the at least one lateral wiring section. Such an edge may be an interior edge at a concave portion of the wiring structure, for instance in a corner of the wiring structure. However, such an edge may also be an exterior edge at a convex portion of the wiring structure. The combination of vertical and lateral wiring sections of the wiring structure being directly connected with one another in form of one or more edges allows providing wiring structures even for complex electric connection tasks. For instance, the formation of one or more such edges may be advantageous when forming redistribution layers or structures.

In an embodiment, the connection body is free of active components. Active components may denote electronic components able to control current by another electrical signal (for instance transistors, analog integrated circuits or digital integrated circuits). In contrast to this, components which are not able to control current by another electrical signal may be called passive devices (for instance a resistor or a capacitor). While simple passive devices may also be integrated in the interior of the connection body, the connection body itself is preferably free of integrated active components in the described embodiment. Such active components may be surface mounted on the connection body, and may be for example embodied as the one or more electronic chips.

In an embodiment, the electrically conductive wiring structure tapers towards an interior of the base structure. In other words, a lateral extension of the wiring structure in a surface region of the base structure may be larger than in an interior of the base structure.

In an embodiment, the base structure is made of an electrically insulating material. Therefore, electrically conductive paths supported by the connection body may be exclusively defined by the wiring structure. The surrounding base structure however may provide a reliable electric connection. Also for this reason it may be advantageous that the base structure is made of a homogeneous dielectric material.

In an embodiment, the electrically conductive wiring structure is made of a thermally conductive material, in particular a material which has a thermal conductivity of at least 50 W/mK. By configuring the electrically conductive wiring structure from a thermally highly conductive material (such as copper or aluminum), the material of the wiring structure may also contribute to the removal of heat generated during operation of the package and being caused, for instance, by the operation of the one or more electronic chips.

In an embodiment, the package comprises an at least partially electrically conductive carrier on which the electronic chip is mounted. For instance, such a chip carrier may comprise a leadframe and/or a ceramic sheet covered on both opposing main surfaces with a respective metallic layer (in particular a Direct Aluminium Bonding (DAB) substrate and/or a Direct Copper Bonding (DCB) substrate).

In a preferred embodiment, the carrier is however a leadframe. Such a leadframe may be a sheet-like metallic structure which can be patterned so as to form one or more mounting sections for mounting the one or more electronic chips of the package, and one or more lead sections for electric connection of the package to an electronic environment when the electronic chip(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically highly advantageous configuration in which a low ohmic connection of the at least one electronic chip can be combined with a robust support capability of the leadframe. Furthermore, a leadframe may contribute to the thermal conductivity of the package and may remove heat generated during operation of the electronic chip(s) as a result of the high thermal conductivity of the metallic (in particular copper) material of the leadframe. A leadframe may comprise for instance aluminum and/or copper.

In an embodiment, the pad is electrically connected to the carrier by the wiring structure. Thus, the function of the wiring structure may substitute the conventional function of a bond wire, a bond ribbon or a clip. While bond wires or the like need to be assembled one after the other in a serial process and therefore involving a high consumption of time, wiring structures integrated in a base structure of glass or semiconductor oxide material may be connected in a batch process and/or on wafer level for multiple package at the same time. Thus, the parallel connection of multiple electronic chips of multiple packages with the carrier by the wiring structure enables a significantly simplified manufacturing of the packages.

In an embodiment, the wiring structure is composed of multiple connected sections with different shape in different layers. For instance, different sections may have a different ratio between thickness in the thickness direction of the base structure on the one hand and length and/or width in a direction perpendicular to the thickness direction of the base structure on the other hand. The difference dimensions and shapes of the different sections may be easily defined by correspondingly adjusting etch parameters of etching processes etching recesses in the base structure. These recesses may then be filled with electrically conductive material for forming the wiring structure. For instance, adjustable etching parameters may be the shape and size of an etching window in a hard mask, and the etching time (having an impact on the depth of the etching), an etching type (for instance defining a symmetric or asymmetric characteristics of the etching process), etc.

In an embodiment, the connection body is a plate. In particular, a length dimension and/or a width dimension of the connection body may be at least twice of, in particular at least five times of a thickness of the connection body. A multistage etching process for defining multiple connected recesses in a glass or semiconductor oxide based base structure is in particular appropriate for accurately forming various recesses in different depths and dimensions. This allows, in turn, properly defining the wiring structure with the opportunity to even define large ratios between lateral width and thickness. For instance, a ratio between a lateral width and a thickness of the wiring structure can be at least 5, in particular at least 10, more particularly at least 50. This may in particular allow forming a redistribution structure in a compact way.

In an embodiment, the connection body comprises a cavity in which the electronic chip and the pad are arranged so that a hollow space remains between the connection body and the electronic chip. In such an embodiment, the connection body may be directly connected with either only the chip or both the chip and a carrier (if present). The cavity may be dimensioned so as to properly accommodate the chip therein. A connection body with multiple cavities, each for accommodating at least one respective chip, may be advantageously used for a batch manufacturing process for producing multiple packages in parallel.

In an embodiment, the wiring structure delimits part of the cavity. This makes it possible to simultaneously accommodate the chip in the cavity and simultaneously electrically connect the chip pad with the wiring structure of the connection body.

In an embodiment, the electronic chip contains at least one, in particular multiple transistors (such as field-effect transistors, in particular metal oxide semiconductor field-effect transistors).

In an embodiment, the electronic chip comprises a transistor and the pad is a gate pad electrically connected to the wiring structure. In such an embodiment, the electronic chip may be a transistor chip fulfilling a transistor function. Corresponding applications may be from the field of power semiconductor technology. For instance, multiple of such electronic chips of the package may provide a half bridge function, a full bridge function, a converter function, etc.

In an embodiment, the method comprises forming a plurality of recesses having different depths and different lateral extensions in the base structure, and filling the recesses at least partially with electrically conductive material to thereby form the electrically conductive wiring structure. By taking this measure, substantially any desired arrangement of one or more vertical wiring sections and one or more lateral or horizontal wiring sections may be formed with high accuracy and in a simple way.

In an embodiment, the method comprises forming the plurality of recesses by etching the base structure. Glass or semiconductor oxide base structure may be efficiently etched in particular by wet etching.

In an embodiment, the etching comprises carrying out a plurality of etching stages for etching with different depths and different lateral extensions in the base structure. Different etching stages with different etching windows and different etching times may allow manufacturing connected recesses with different lateral and/or vertical dimensions.

In an embodiment, the etching comprises covering the base structure with a multilayer hard mask, exposing a first surface portion of the base structure by removing a first portion of the multilayer hard mask, thereafter etching the exposed first surface portion of the base structure to thereby form a first one of the recesses, exposing a second surface portion of the base structure by removing a second portion of the multilayer hard mask, and thereafter etching the exposed second surface portion of the base structure to thereby form a second one of the recesses. Highly advantageously, a multilayer hard mask may be formed, wherein an opening window of each hard mask layer may define a lateral extension of each individual one of the recesses. By using a stepped multilayer hard mask, a profile of multiple connected recesses in the base structure may be defined which can be translated, by etching, into a sequence of recesses of different vertical and lateral extensions. After filling these recesses, the wiring structure with both vertical and lateral sections can be obtained. It is possible that the described procedure is repeated multiple times.

Preferably, different layers of the multilayer hard mask may be made of different materials. By taking this measure, one or more stop layers may be implemented in the multilayer hard mask.

In an embodiment, the hard mask comprises an alternating sequence of at least two mask layers and at least two stop layers. Thus, for each recess, a set of one assigned mask layer and one assigned stop layer may be foreseen. The alternating procedure of patterning a respective mask layer and stopping the etching process on an assigned stopping layer allows manufacturing recesses of multiple depth and lateral dimensions in a simple and precise way.

In an embodiment, the filling comprises forming a seed layer in one or more of the recesses in the base structure (in particular by sputtering or electroless deposition), and thereafter depositing further electrically conductive material on the seed layer (in particular by plating or galvanic deposition). Seed layer formation may be accomplished by electroless deposition for preparing a subsequent plating or galvanic process. By the combination of a seed layer process with a subsequent galvanic deposition process, it may be possible to significantly increase the efficiency of the filling procedure.

In an embodiment, the method comprises forming the electrically conductive wiring structure in a front side of the base structure, and subsequently thinning the base structure from a back side. In particular, the method may comprise thinning the base structure until the electrically conductive wiring structure is exposed at the back side. Thus, back side thinning after front side plating may allow exposing the buried wiring structure from its back side so that only a thin portion of the base structure needs to be filled with electrically conductive material, and nevertheless an electrically conductive through hole contact may be formed.

In an embodiment, forming the electrically conductive wiring structure comprises connecting two partial base structure bodies with partial wiring structures with one another so that the wiring structure is composed partially by the combination of the connected two partial base structure bodies. In particular, it may be possible to form blind hole type recesses in surface portions of each of the partial base structures and to fill these recesses with electrically conductive material. The two partial base structure bodies may then be connected to one another so that their partial wiring structures are brought in direct physical contact with one another Thinning the obtained body from both sides may then allow obtaining a base structure with very small thickness and a metallic through connection composed of the connected partial wiring structures. Such a manufacturing procedure combines the simple handling of relatively thick base structure bodies with the formation of a precisely defined through connection in form of the wiring structure in a finally very thin base structure.

In an embodiment, the method comprises exposing a front side of the wiring structure by removing material of one of the connected base structure bodies, mounting an electronic chip on the exposed wiring structure, and exposing a back side of the wiring structure by removing material of the other one of the base structure bodies. In particular, the above-mentioned double-sided thinning may be accomplished in a way that after a front side thinning, chip mounting may be carried out before back side thinning.

In an embodiment, the method comprises, before exposing the back side, protecting the electronic chip by a protection structure. Thus, the—in many cases sensitive—electronic chip can be protected during back side thinning by the protection structure. For instance, the protection structure may be a lid or cap covering the electronic chip during back side thinning. It is also possible that the protection structure is a coating of the electronic chip on the front side.

In an embodiment, the method comprises, after exposing the back side, removing the protection structure. Thus, the protection structure may be a temporary protective structure which is removed before completing formation of the package. In other words, the protection structure does not form part of the readily manufactured package in the described embodiment.

In an embodiment, the method comprises electrically connecting the wiring structure with the electronic chip by soldering. Additionally or alternatively, the method comprises mounting the electronic chip on a carrier, in particular by soldering. Soldering is a simple and straightforward procedure of establishing the mentioned electrically conductive connection.

As substrate or wafer forming the basis of the electronic chip(s), a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 6 to FIG. 8 show different views of a package according to an exemplary embodiment.

FIG. 9 to FIG. 30 show structures obtained during carrying out a method of manufacturing a connection body for a package according to an exemplary embodiment.

FIG. 31 to FIG. 52 show structures obtained during carrying out a method of manufacturing a connection body for a package according to another exemplary embodiment.

DETAILED DESCRIPTION

Figure 1:
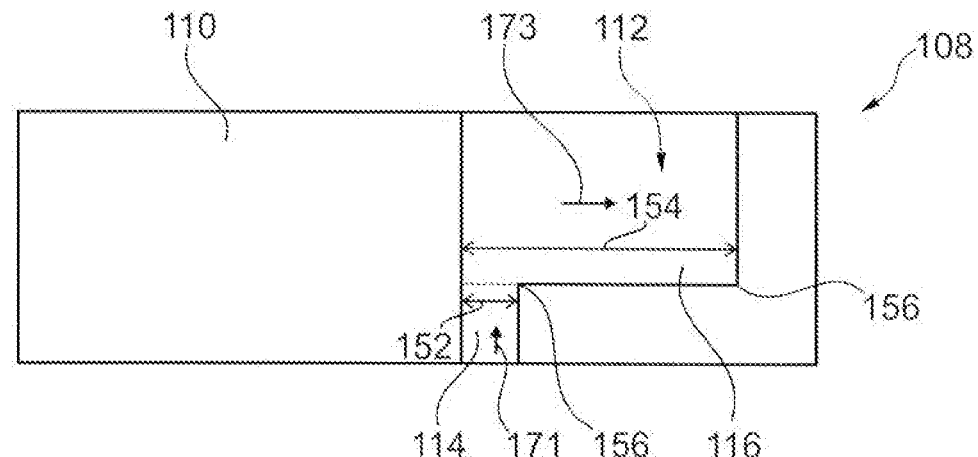
FIG. 1 shows a cross-sectional view of a connection body according to an exemplary embodiment.

The illustration in the drawing is schematically.

Before describing further exemplary embodiments in further detail, some basic considerations of the present invention will be summarized based on which exemplary embodiments have been developed.

Adjustment of an application-specific form factor and the requirement of manufacturing with low effort becomes more and more important in package technology. A lower limit for miniaturization is the requirement of maintaining a sufficient creepage distance between high-voltage pads of an electronic chip. In terms of costs of manufacturing packages, the costs of the package become increasingly important in view of reduced semiconductor costs. What concerns the effort for manufacturing the package, the effort for copper structures as well as the effort for the serial pick and place procedures (in particular chip bonding, soldering, diffusion soldering, wire bonding, etc.) may be relevant.

Conventionally, an electronic chip is soldered on a leadframe, followed by wire bonding and encapsulation in an encapsulant. Both the placement of the chip on the leadframe as well as the wire bonding is a serial process involving significant effort as well as being time consuming.

According to an exemplary embodiment, a packaging architecture is provided which allows meeting constraints in terms of creeping distances by integrating a wiring structure (preferably, but not necessarily a redistribution structure) in an electrically insulating base structure of a connection body. The base structure may be preferably made of a semiconductor oxide material or glass or a silicon oxide layer on a silicon base. Advantageously, formation of the connection bodies and the packages may be done at least partially on wafer level, i.e. using an insulating semiconductor oxide wafer or glass wafer or semiconductor oxide surface region of a semiconductor wafer as a base structure of the connection bodies for multiple packages. By forming the wiring structure (or even redistribution structure) on wafer level, a parallel processing of multiple packages with a precisely definable form factor is possible. Such a concept may be implemented in an embodiment by the provision of a connection body with defined recesses for the semiconductor chips to be packaged. Such an architecture is compatible in an embodiment with solderable integrated copper wiring structures (such as redistribution layers).

In such an embodiment, a hard mask being patterned several times can be used for a subsequent wet chemical etching into material of the base structure of the connection body. The hard mask topology can be converted into a depth ratio of for example 1 to 10 to 1 to 200 and can be provided subsequently with a seed layer for subsequent copper deposition. The mentioned copper deposition provides current carrying copper in an amount which is sufficient for the thickness and dimensioning requirements of the electronic chips. The mentioned copper material may serve simultaneously as a solderable metallization for the electronic chip and for the package. The distance of the copper planes to the electronic chip can be adjusted by the wet chemical etching in such a way that any undesired influence on the fields, in particular in the high-voltage region, can be safely prevented. After placement of the semiconductor chips by a parallel method (for instance by a carrier body on which the electronic chips, which may be picked from a saw frame, are placed by a photo patterned adhesive) and after a soft solder procedure (the solder may be already applied on to the previously empty package) the entire package may be covered by a protection structure (for instance epoxy or imide) for instance using an immersion procedure, before being singulated. As an alternative, it is possible to attach a lid (for instance made of glass) shielding the electronic chip with regard to an exterior surrounding.

According to an exemplary embodiment, a wiring structure (in particular a redistribution structure) can be formed in a semiconductor oxide base structure of a connection body. A pad of an electronic chip may be connected to such a wiring structure, preferably by soldering. Also preferably, the pad may be a gate pad. Optionally, the electronic chip may be connected on a carrier (such as a leadframe). The latter may, in turn, be connected to the connection body. Alternatively, the connection body may also serve as a carrier mechanically carrying the electronic chip, so that a separate carrier (such as a leadframe) may be dispensable.

In an embodiment, the manufacturing of the wiring structure (in particular redistribution structure) can be carried out in the semiconductor oxide-based base structure. This allows carrying out at least part of the packaging procedure on wafer level and therefore enables a parallel processing of multiple packages at the same time. The semiconductor chips or chips may be mounted on a carrier (such as a leadframe) in parallel. The connection body may be attached as a wafer. The electronic chips may be connected to the connection body, preferably by soldering.

More generally, an exemplary embodiment provides a method for forming a semiconductor package, wherein the method comprises arranging at least one electronic chip on a first substrate (for instance a chip carrier such as a leadframe), forming a wiring or rewiring structure in a second substrate (wherein the second substrate may be an electrically insulating substrate), and attaching the second substrate to the first substrate such that the wiring structure contacts the at least one electronic chip. Advantageously, the wiring structure may be formed before attaching the second substrate to the first substrate.

FIG. 1 shows a cross-sectional view of a connection body 108 according to an exemplary embodiment.

The connection body 108 comprises a base structure 110 comprising or consisting of silicon oxide or glass. Furthermore, an electrically conductive wiring structure 112 (for instance made of copper) is provided in the base structure 110. The electrically conductive wiring structure 112 comprises a vertical wiring section 114 (see arrow 171) extending vertically through part of the base structure 110. Moreover, the electrically conductive wiring structure 112 comprises a lateral wiring section 116 (see arrow 173) connected with the vertical wiring section 114. The lateral wiring section 116 extends laterally (according to FIG. 1 horizontally) in the base structure 110 and perpendicular with regard to the vertical wiring section 114. The vertical wiring section 114 has a first lateral dimension 152 in the base structure 110. The lateral wiring section 116 being connected with the vertical wiring section 114 has a second lateral dimension 154 in the base structure 110, which is larger than the first lateral dimension 152. As a result, an edge 156 is formed at an interface between the vertical wiring section 114 and the lateral wiring section 116 in a corner of the wiring structure 112. A further edge 156 is formed at a convex section of the wiring structure 112.

Figure 2:
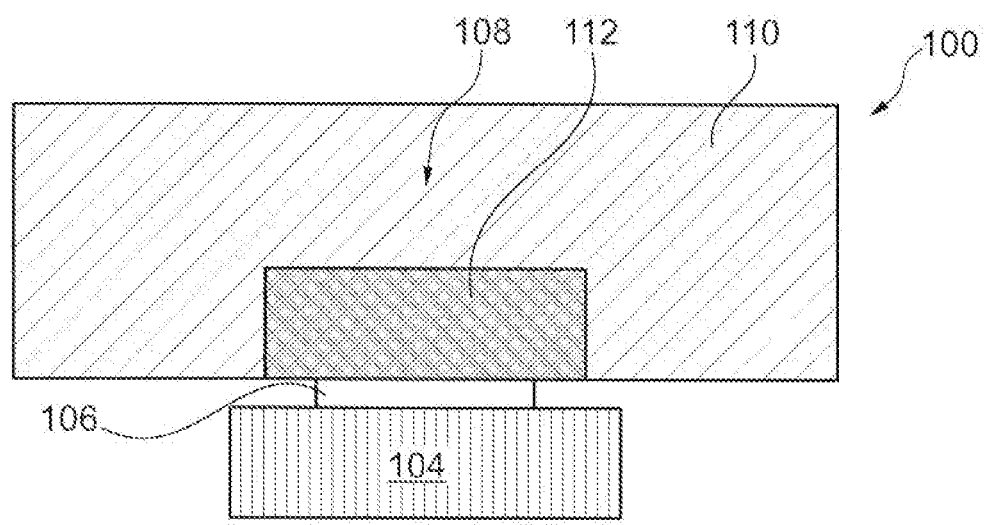
FIG. 2 shows a cross-sectional view of a package according to an exemplary embodiment.

FIG. 2 shows a cross-sectional view of a package 100 according to an exemplary embodiment.

The shown package 100 comprises an electronic chip 104 (such as a semiconductor power chip) which has an electrically conductive (in particular copper) pad 106 (one or more further pads, not shown, of the electronic chip 104 may be provided as well). A connection body 108 is provided as well and comprises a plate shaped base structure 110 made of glass. An electrically conductive wiring structure 112 (for instance made of copper as well) is formed in the base structure 110. The electronic chip 104 is mounted on the connection body 108 so that its pad 106 is connected to the electrically conductive wiring structure 112.

Figure 3:
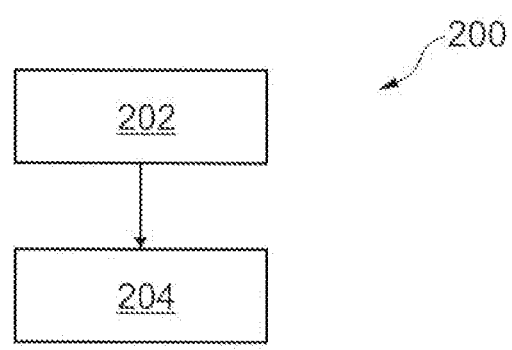
FIG. 3 shows a flowchart illustrating procedures of a method of manufacturing a connection body according to an exemplary embodiment.

FIG. 3 shows a flowchart 200 illustrating procedures of a method of manufacturing a connection body 108 according to an exemplary embodiment.

The method of manufacturing the connection body 108 comprises providing a base structure 110 made of a semiconductor oxide material (see box 202). The method further comprises forming an electrically conductive wiring structure 112 in the base structure 110 (see box 204). The electrically conductive wiring structure 112 may be formed with a vertical wiring section 114 extending vertically through the base structure 110 and with a lateral wiring section 116 connected with the vertical wiring section 114 and extending laterally in the base structure 110.

Figure 4:
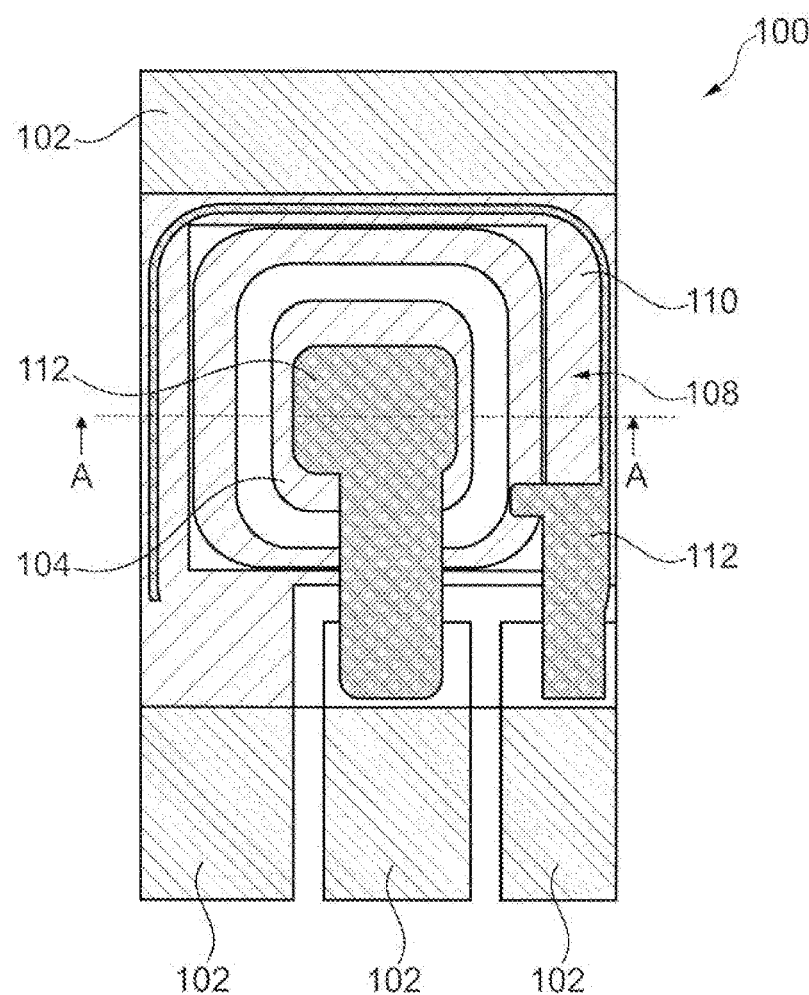
FIG. 4 shows a plan view of a package according to an exemplary embodiment.
Figure 5:
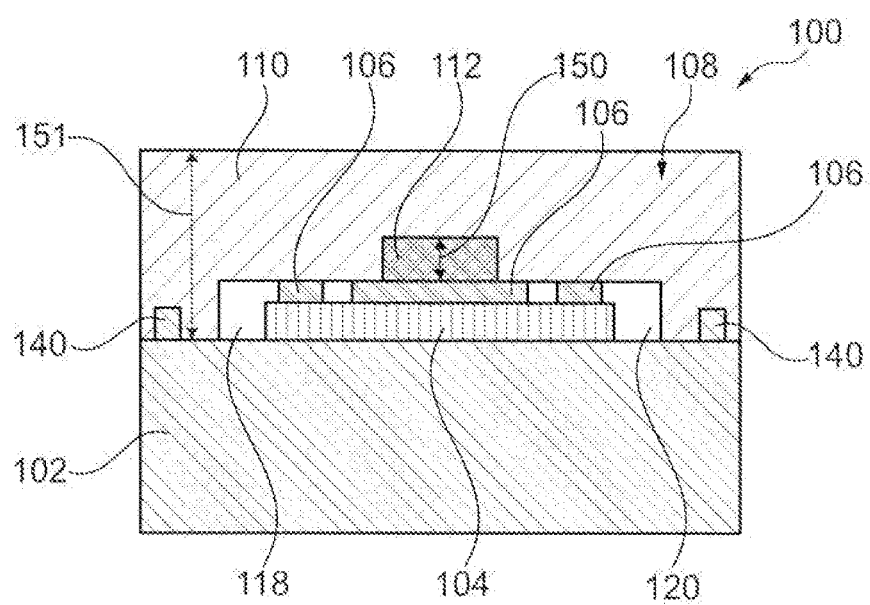
FIG. 5 shows a cross-sectional view of the package of FIG. 4.

FIG. 4 shows a plan view of a package 100 according to an exemplary embodiment. FIG. 5 shows a cross-sectional view of the package 100 of FIG. 4. More specifically, the cross-sectional view of FIG. 5 corresponds to a cutting line A-A shown in FIG. 4.

The package 100 comprises an electronic chip 104 having pads 106 on an upper main surface thereof. For example, the electronic chip 104 comprises a transistor. The pad 106 being electrically connected to a wiring structure 112 is a gate pad.

Furthermore, the package 100 comprises a plate shaped connection body 108 which is composed of a base structure 110 made of glass and the electrically conductive wiring structure 112 integrated in the base structure 110 and made of copper. The electrically conductive wiring structure 112 of the connection body 108 is directly physically connected to the central pad 106 of the electronic chip 104. Although not shown in FIG. 4 and FIG. 5, the wiring structure 112 may be composed of multiple connected sections 114, 116 (compare for instance FIG. 1 or FIG. 30) with different shape in different layers. As can be seen in FIG. 5, the electrically conductive wiring structure 112 extends only through a subportion 150 of the thickness 151 of the base structure 110 without extending through the entire base structure 110.

Moreover, the package 100 comprises an electrically conductive chip carrier 102 on which the electronic chip 104 is mounted. The chip carrier 102 is here embodied as a leadframe made of copper.

As can be taken from FIG. 5, the connection body 108 comprises a cavity 118 in which the electronic chip 104 including its pads 106 are accommodated. Since the cavity 118 is larger than the electronic chip 104, a hollow space 120 remains between the connection body 108, the electronic chip 104 and the carrier 102. The wiring structure 112 delimits part of a top wall of the cavity 118.

As can be taken best from FIG. 4, the central pad 106 is electrically connected via the wiring structure 112 with the carrier 102. The wiring structure 112 may function in a similar way as a bond wire or a clip, but is embedded in the glass material of the base structure 110. This simplifies the manufacturability of the package 100 in a batch procedure or on wafer level, see FIG. 53. Furthermore, formation of the wiring structure 112 embedded in the base structure 110 is a simple, accurate and efficient way of establishing an electric contact of electronic chip 104 of package 100.

Dummy solder structures 140 are shown in FIG. 5 as well.

FIG. 6 to FIG. 8 show different views of a package 100 according to another exemplary embodiment. FIG. 6 illustrates a three-dimensional front side view of the package 100. FIG. 7 shows a three-dimensional back side view of the package 100. FIG. 8 shows a partially transparent plan view as well as two cross-sectional views along lines B-B and C-C indicated in FIG. 8 is well.

FIG. 6 illustrates that the base structure 110 forms a cover glass of the package 100. The electronic chip 104 is configured as a source down MOSFET (metal oxide semiconductor field effect transistor). FIG. 7 shows a source terminal 170, a gate terminal 172 and a drain terminal 174. As indicated by reference numeral 168, the creepage is properly shrinkable with the shown design (for instance to a value of 1.9 mm in the illustrated embodiment). As shown, the gate terminal 172 can be arranged next to the source terminal 170.

FIG. 9 to FIG. 30 show structures obtained during carrying out a method of manufacturing a connection body 108 for a package 100 according to an exemplary embodiment.

Referring to FIG. 9, a dielectric plate 176 preferably made of glass or of silicon dioxide is shown. Material of the plate 176 forms part of a base structure 110 of the formed connection body 108 (see FIG. 30).

Referring to FIG. 10, a silicon layer 178 (for instance A-Si) is deposited on the plate 176, see detail 210. As a result, a hard mask of silicon material (or alternatively of any other appropriate hard mask material) is obtained.

Referring to FIG. 11, a first photoresist layer 180 is applied to a front side of the structure shown in FIG. 10.

Referring to FIG. 12, the first photoresist layer 180 is patterned by a lithographic process to form a first opening 182 in the hard mask, thereby exposing the dielectric plate 176.

Referring to FIG. 13, a first glass etching procedure is carried out etching a first recess 126 in the dielectric plate 176 through the and defined by the first opening 182. For instance, a depth of the first recess 126 is 20 μm.

Referring to FIG. 14, the first photoresist layer 180 is removed, for instance by stripping.

Referring to FIG. 15, a second photoresist layer 184 is applied to a front side of the structure shown in FIG. 14.

Referring to FIG. 16, the second photoresist layer 184 is patterned by a further lithographic process to thereby form a second opening 186 exposing the dielectric plate 176 by opening the hardmask. The second opening 186 is larger than the first opening 182.

Referring to FIG. 17, a second glass etching procedure is carried out etching a second recess 126 in the dielectric plate 176 through second opening 186. For instance, a depth of the second recess 126 is 20 μm. The mentioned etching procedure furthermore increases the depth of the first recess 126, for instance up to 40 μm. Compared to the first recess 126, the second recess 126 is wider and shallower.

Referring to FIG. 18, the second photoresist layer 184 is removed, for instance by stripping.

Referring to FIG. 19, the hard mask (i.e. the silicon layer 178 in the illustrated embodiment) is removed.

As a result, an intermediate structure is obtained in which the recesses 126 have been formed by etching in the dielectric plate 176 forming the basis for part of the later base structure 110. The described etching procedure comprises carrying out multiple etching stages for etching with different depths and different lateral extensions in the dielectric plate 176 as a pre-form of the base structure 110.

Referring to FIG. 20, a procedure of filling the recesses 126 with electrically conductive material, such as copper, starts. According to FIG. 20, a seed layer 132 is formed lining the recesses 126 in the dielectric plate 176—as pre-form or part of the base structure 110—by electroless deposition, see detail 220. As a result of this line deposition procedure, the recesses 126 are lined by the seed layer 132, which is here made of copper material. This lining procedure prepares a subsequent galvanic deposition procedure and renders the latter more efficient.

Referring to FIG. 21, further electrically conductive material 134 is deposited on the seed layer 132 by galvanic deposition. As a result, the recesses 126 are completely filled with electrically conductive material (such as galvanic copper, for instance with a thickness of 20 μm to 30 μm) which later forms part of electrically conductive wiring structure 112 (compare FIG. 30). As can be taken from FIG. 21, also surface portions of the dielectric plate 176 next to the recesses 126 are covered with copper material.

Referring to FIG. 22, the upper main surface of the structure shown in FIG. 21 is made subject to a grinding procedure for removing copper material outside of the recesses 126.

Figure 24:
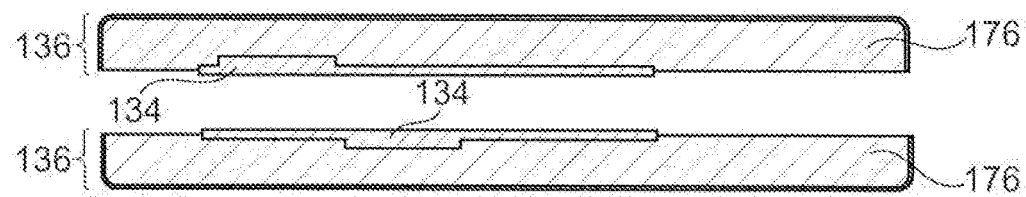

Referring to FIG. 23, a further etching procedure is carried out for etching a surface portion of the dielectric plate 176 (for instance by HF etching). This simplifies a subsequent copper thermal compression bonding procedure (compare FIG. 25). As a result of the procedure according to FIG. 23, a partial base structure body 136 (which may also be denoted as glass package) is obtained, which is further processed as described in the following:

Referring to FIG. 24, the electrically conductive wiring structure 112 may be formed by connecting two partial base structure bodies 136 of the type as shown in FIG. 23 with partial wiring structures 112 with one another so that the wiring structure 112 is composed partially by each of the two partial base structure bodies 136. In the shown embodiment, the two partial base structure bodies 136 to be connected are not completely identical. One of the partial base structure bodies 136 is flipped or turned around by 180° so that the electrically conductive material 134 of both partial base structure bodies 134 faces each other.

Figure 25:
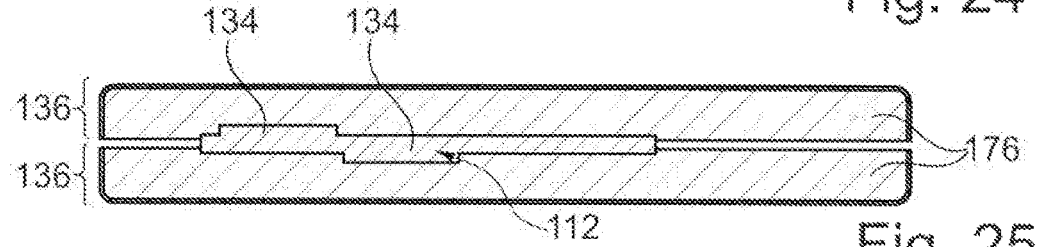
Figure 30:
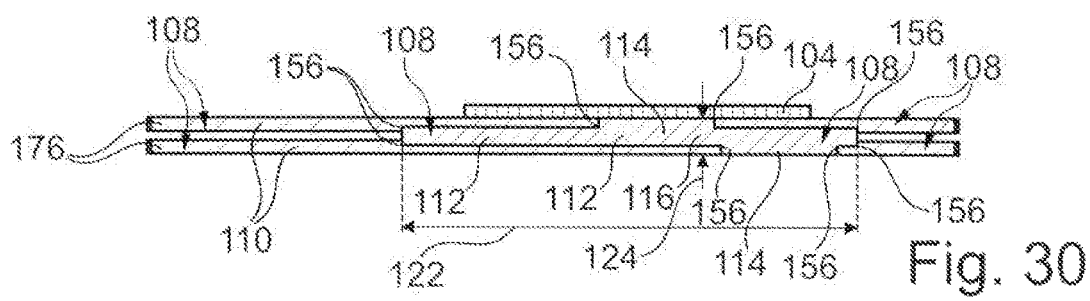

Referring to FIG. 25, the partial base structure bodies 134 are connected by copper thermal compression bonding so that the electrically conductive material 134 of both partial base structure bodies 134 together forms an integral electrically conductive structure, i.e. the wiring structure 112 of the readily manufactured connection body 108 (compare FIG. 30).

Figure 26:

Referring to FIG. 26, one side of the wiring structure 112 is exposed by removing material of the glass plate 176 of one of the connected base structure bodies 136 by thinning from the back side. Thereby, the copper material of the wiring structure 112 is opened on the back side. The obtained structure may then be turned around or flipped by 180° for further processing.

Figure 27:
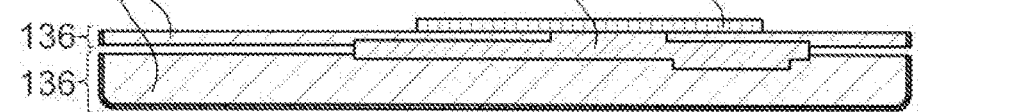

Referring to FIG. 27, an electronic chip 104 is then mounted in a die attach procedure and soldered on the exposed wiring structure 112 (which is now located on the front side).

Figure 28:
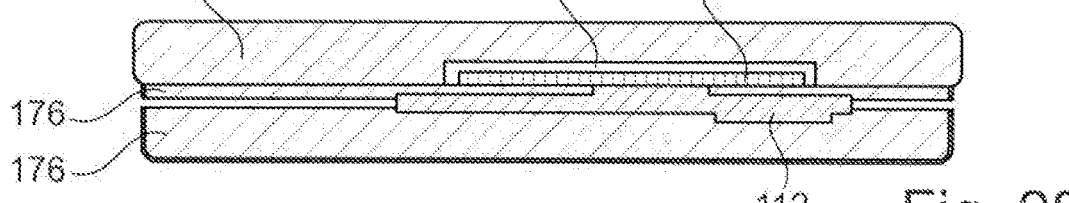

Referring to FIG. 28, the electronic chip 104 is then protected by a protection structure 138, for instance a further class carrier with cavity 188 which is attached to the front side according to FIG. 27.

Figure 29:
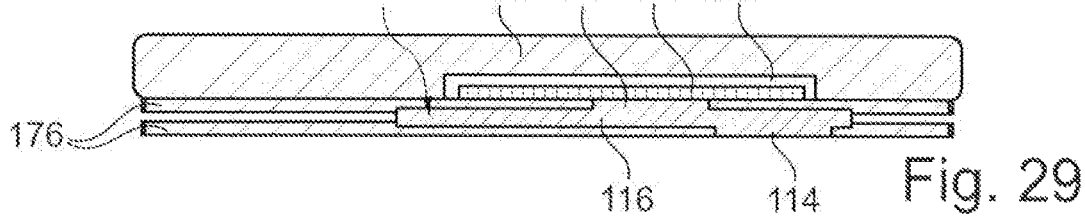

Referring to FIG. 29, a back side of the wiring structure 112 is then exposed by removing material of the glass plate 176 of the other one of the base structure bodies 136. Hence, a further thinning procedure may be carried out to open the copper material of the wiring structure 112 from the other side.

Referring to FIG. 30, the protection structure 138 may then be removed. As can be seen in FIG. 30, the wiring structure 112 comprises vertical wiring sections 114 extending vertically through the base structure 110 (composed of two portions of the former dielectric plates 176) and with a lateral wiring section 116 connected between the vertical wiring sections 114 and extending laterally in the base structure 110.

As a result of this manufacturing procedure, the shown connection body 108 according to an exemplary embodiment is obtained. The connection body 110 comprises the base structure 110 made of glass formed by portions of the two connected glass plates 176. The already described electrically conductive wiring structure 112 is integrated in the glass base structure 110 with vertical wiring sections 114 and a lateral wiring section 116 connected therewith. As shown in FIG. 30, the electrically conductive wiring structure 112 extends vertically (i.e. as a copper filled through hole) through the entire base structure 110 in the shown embodiment. The electrically conductive wiring structure 112 is configured so that edges 156 are formed in an interior of the base structure 110, in particular at interfaces between the vertical wiring sections 114 and the lateral wiring section 116. As a result of the described manufacturing method, the wiring structure 112 of the connection body 108 has a high ratio between a lateral width 122 and a thickness 124 (for instance a ratio of more than five).

In the shown embodiment, the connection body 108 simultaneously serves as a carrier for the electronic chip 104 and for providing a wiring structure 112 for contacting the electronic chip 104. Although not shown in FIG. 30, it is optionally also possible (as in the embodiment of FIG. 4 and FIG. 5, for instance) to mount the electronic chip 104 on an additional chip carrier 102 such as a leadframe, in particular by soldering.

FIG. 31 to FIG. 52 show structures obtained during carrying out a method of manufacturing a connection body 108 for a package 100 according to another exemplary embodiment. As material for a plate 176, it is for example possible to use a semiconductor such as silicon (in particular Si(110)) or glass. The manufacturing process is substantially identical for a plate 176 made of silicon or made of glass in the procedures according to FIG. 31 to FIG. 46 (wherein slight differences are specifically mentioned), and differs in the procedures according to FIG. 47 to FIG. 52. In FIG. 47 to FIG. 52, the process flow for silicon as material of the plate 176 is shown on the left-hand side, and the process flow for glass as material of the plate 176 is shown on the right-hand side.

Referring to FIG. 31, plate 176 is shown which is used as a starting point for the described procedure. As mentioned above, the plate 176 may be made of glass or a semiconductor such as silicon. Material of the plate 176 forms part of a base structure 110 of the formed connection body 108 when the plate 176 is made of glass (see right-hand side of FIG. 52). An insulating layer 175 (compare FIG. 47) constitutes the base structure 110 of the formed connection body 108 when the plate 176 is made of silicon (see left-hand side of FIG. 52).

Referring to FIG. 32, a cover layer 178 (for instance having a thickness of 200 nm and made of silicon oxide when the material of the plate 176 is silicon, and for example having a thickness of 80 nm and being made of A-Si when the material of the plate 176 is glass) may be formed on the plate 176.

Referring to FIG. 33, a first stop layer 166 may be formed on the surface of the structure shown in FIG. 32. For instance, the first stop layer 166 may be a silicon nitride layer, for example having a thickness of 50 nm.

Referring to FIG. 34, a first hard mask layer 164 may be formed on the first stop layer 166. For example, the first hard mask layer 164 may be a TEOS layer (for instance having a thickness of 200 nm) when the material of the plate 176 is silicon or may be a silicon layer (such as A-Si, for instance having a thickness of 100 nm) when the material of the plate 176 is glass. TEOS (tetraethylorthosilicate) may decompose in the presence of oxygen and may form a silicon oxide film.

Referring to FIG. 35, a second stop layer 166 may be formed on the first hard mask layer 164. For instance, the second stop layer 166 may be a silicon nitride layer, for example having a thickness of 50 nm.

Referring to FIG. 36, a second hard mask layer 164 may be formed on the second stop layer 166. For example, the second hard mask layer 164 may be a TEOS layer (for instance having a thickness of 200 nm) when the material of the plate 176 is silicon or may be a silicon layer (such as A-Si, for instance having a thickness of 100 nm) when the material of the plate 176 is glass.

As can be taken from a detail 190, plate 176 may be covered with a multilayer hard mask 158 configured as an alternating sequence of the two mask layers 164 and the two stop layers 166. The different layers (164 on the one hand, 166 on the other hand) of the multilayer hard mask 158 may be made of different materials so as to provide an etch stop function.

Referring to FIG. 37, a first photoresist layer 180 may be formed on the hard mask 158.

Referring to FIG. 38, a first lithography process is carried out by which a first opening 182 is formed in both the first photoresist layer 180 and the uppermost layer (i.e. second hard mask layer 164) of the hard mask 158. The etching process stops at the second stop layer 166. Hence, the hard mask 158 is opened by the described procedure.

Referring to FIG. 39, a second photoresist layer 184 may be formed.

Referring to FIG. 40, a second lithography process is carried out by which a second opening 186 is formed in both the second photoresist layer 184 and the second hard mask layer 164 of the hard mask 158. The etching process stops at the second stop layer 166 in an even larger second opening 186 compared to the first opening 182. In the first opening 182 however, the second lithography process etches away the first hard mask layer 164. As a result, a first surface portion 160 of the plate 176 is exposed by removing a portion of the multilayer hard mask 158 relating to the first opening 182.

Referring to FIG. 41, a third photoresist layer 192 is formed.

Referring to FIG. 42, a third lithography process is carried out by which the first hard mask layer 164 is removed from at least part of the second opening 186. The etching process stops at the second stop layer 166 in part of the second opening 186, except in the region of the first opening 182 where the first surface portion 160 is already exposed.

Referring to FIG. 43, a further etching procedure is carried out (for instance a 25 μm silicon etch in case of silicon as material of plate 176, or a glass etch when the material of plate 176 is glass). Thus, the exposed first surface portion 160 of the plate 176 is etched to thereby form a first recess 126 in the first opening 182 below the first surface portion 160.

Referring to FIG. 44, the hard mask 158 is further opened also in the second opening 186. As a result, also a second surface portion 162 of the plate 176 is exposed by removing a further portion of the multilayer hard mask 158. Thereafter, the exposed second surface portion 162 of the base structure 110 is etched to thereby form a second one of the recesses 126. At the same time, the first mentioned recess 126 is further deepened. The mentioned procedure may carry out a 25 μm silicon etch when the material of the plate 176 is silicon, or a glass etch when the material of the plate 176 is glass.

Referring to FIG. 45, a further portion of the hard mask 158 is removed. In this additional hard mask opening procedure, a further 25 μm silicon etch can be carried out when the material of the plate 176 is silicon. When the material of plate 176 is glass, a further glass etch may be carried out. As a result of these procedures, the recesses 126 are further extended both in vertical and lateral direction, as can be seen in FIG. 45.

Referring to FIG. 46, the hard mask 158 is completely opened and fully removed.

Referring to FIG. 47, an electrically insulating layer 175 is formed on the surface of the structure shown in FIG. 46 when the material of the plate 176 is silicon. For instance, the insulating layer 175 may be a silicon oxide layer. It is in particular possible that the insulating layer 175 is a 1 μm EOX(+TEOS) layer.

No electrically insulating layer 175 is however formed on the surface of the structure shown in FIG. 46 when the material of the plate 176 is glass.

This difference can be seen in details 230, 235 of FIG. 47.

Referring to FIG. 48, a liner deposition procedure is carried out for forming a seed layer 132. This procedure may be carried out in a similar way as described above referring to FIG. 20. Resulting structures can be seen in details 240, 245 of FIG. 48.

Referring to FIG. 49, a further lithography process for pattern plating is carried out. In this context, a further photoresist 194 is formed and is maintained only outside of the recesses 126.

Referring to FIG. 50, a galvanic copper plating procedure is carried out for forming electrically conductive structure 134. This procedure may be carried out in a similar way as described above referring to FIG. 21.

Referring to FIG. 51, the further photoresist 194 is removed, and a liner etching procedure can be carried out. As a result, the seed layer 132 may be removed from surface portions outside of the recesses 126. Although not shown, an epoxy filling procedure may be carried out as well.

Referring to FIG. 52, a thinning procedure is carried out by which material of the structure of FIG. 51 is removed from the back side to thereby expose the electrically conductive structure 134/electrically conductive wiring structure 112 on both opposing main sides of the obtained connection body 108. By the described process, the electrically conductive wiring structure 112 is firstly formed on a front side. By subsequently thinning from a back side, the electrically conductive wiring structure 112 is exposed also at the back side.

As illustrated in FIG. 52, the electrically conductive wiring structure 112 spatially spreads a lateral dimension 152 of the electrically conductive wiring structure 112 on the back side of the connection body 108 to a larger lateral dimension 154 of the electrically conductive wiring structure 112 on the front side. As shown, the electrically conductive wiring structure 112 tapers starting from the front side towards an interior of the shown connection bodies 108.

A detail 250 on the left-hand side of FIG. 52 shows that, when the material of the plate 176 is silicon (i.e. a semiconducting material), the electrically insulating layer 175 forms the electrically insulating base structure 110. When the material of the plate 176 is glass (i.e. an electrically insulating material), the remaining material of the plate 176 forms the electrically insulating base structure 110.

Figure 53:
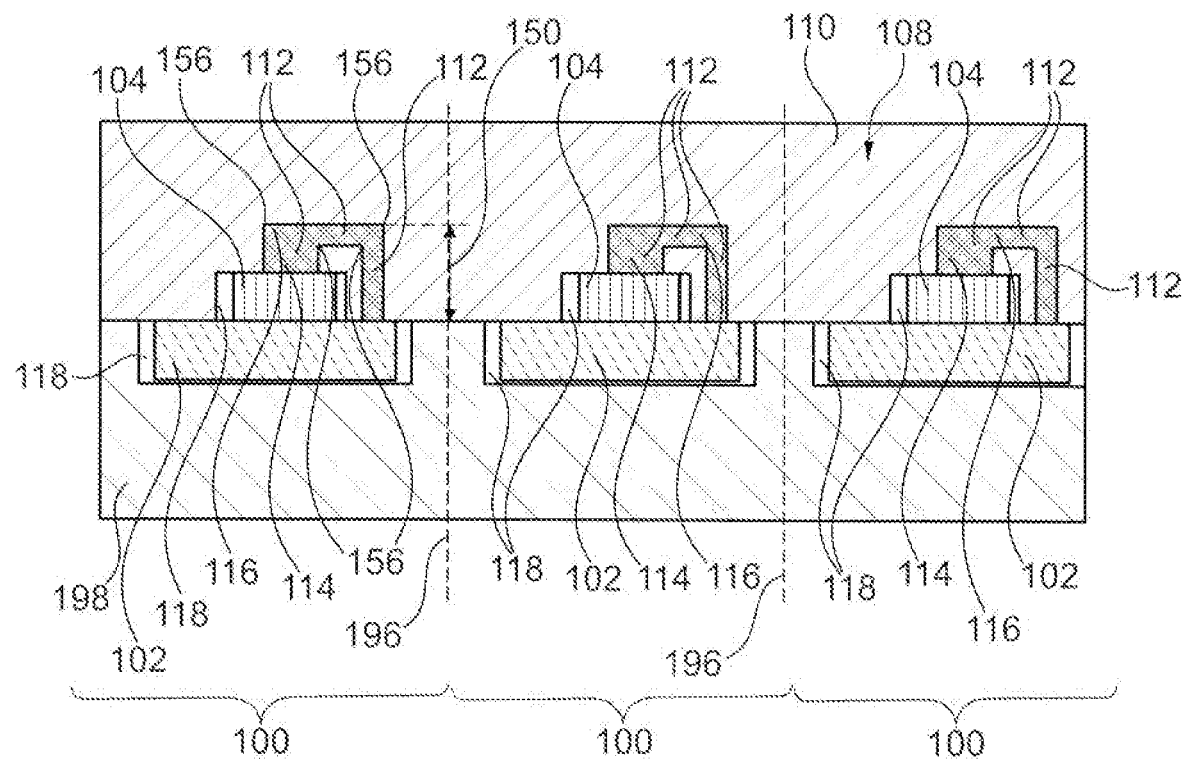
FIG. 53 shows a cross-sectional view of still integral packages to be subsequently separated into individual packages manufactured in a batch procedure according to an exemplary embodiment.

FIG. 53 illustrates that packages 100 similar to the type shown in FIG. 4 and FIG. 5 can be manufactured in a batch procedure or on wafer level according to an exemplary embodiment. According to FIG. 53 (showing multiple packages 100 prior to singularization), portions of a leadframe as carrier 102 are accommodated in accommodation volumes of a mounting base 198. Electronic chips 104 are mounted on the carrier 102. The connection body 108 with the embedded wiring structures 112 and having chip accommodating cavities 118 is connected from a top side so as to form a "carrier wafer-connection body wafer" arrangement. The so obtained arrangement can be singularized into multiple packages 100 by separating (for instance sawing or etching) along separation lines 196.

Figure 54:
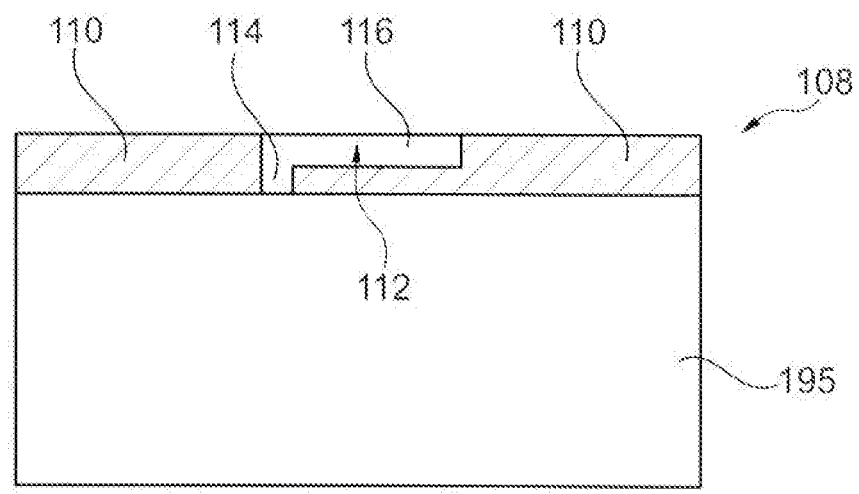
FIG. 54 shows a cross-sectional view of a connection body according to another exemplary embodiment.

FIG. 54 illustrates a cross-sectional view of a connection body 108 according to another exemplary embodiment.

The connection body 108 according to FIG. 54 comprises a support body 195 which is here configured as a silicon body (in particular a silicon wafer). On the support body 195, the base structure 110 (here embodied as a silicon dioxide surface layer) is formed. The wiring structure 112 is exclusively formed in the base structure 110 in the shown embodiment. For instance, the base structure 110 on the support body 195 may be formed by oxidizing a surface portion of a silicon wafer. Subsequently, the wiring structure 112 may then be formed in the base structure 110 (for instance by a method similar to FIG. 9 to FIG. 23).

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A semiconductor device, comprising
    a chip carrier comprising a substantially planar mounting surface;
    an electronic chip that comprises an upper main surface with a conductive pad and a rear surface opposite the upper main surface;
    a connection body that comprises a glass base structure and an electrically conductive wiring structure, wherein the connection body is mounted on the chip carrier with the glass base structure facing and adhered to the mounting surface, wherein an enclosed cavity is disposed between the connection body and the chip carrier, wherein the electronic chip is disposed within the enclosed cavity, wherein the electrically conductive wiring structure is connected to the conductive pad of the electronic chip, wherein the electronic chip is mounted on the chip carrier such that the rear surface is flush against the mounting surface, wherein the chip carrier is an electrically conductive leadframe.

2. The semiconductor device of claim 1, wherein the wiring structure comprises a conductive track that is electrically connected to the conductive pad, and wherein the conductive track laterally extends across an outer edge side of the electronic chip.

3. The semiconductor device of claim 2, further comprising an electrically conductive lead that is spaced apart from the chip carrier, wherein the conductive track laterally extends across a gap between the electrically conductive lead and the chip carrier, and wherein the conductive track electrically connects the lead to the conductive pad.

4. The semiconductor device of claim 1, wherein a portion of the glass base structure directly contacts the electronic chip.

5. The semiconductor device of claim 1, wherein the glass base structure comprises an outer surface that is opposite from the mounting surface, and wherein the outer surface of the glass base structure forms a complete outer side of the semiconductor device.

6. The semiconductor device of claim 5, wherein the electrically conductive wiring structure is completely covered by the glass base structure.

7. The semiconductor device of claim 1, wherein a ratio between a lateral width and a thickness of the electrically conductive wiring structure is at least 5.

8. The semiconductor device of claim 1, wherein the electronic chip is a semiconductor chip that comprises at least one integrated power transistor.

9. The semiconductor device of claim 1, wherein the glass base structure comprises a recess that extends from a planar outer surface, wherein the planar outer surface of the glass base structure faces and is adhered to the mounting surface of the chip carrier, and wherein the enclosed cavity is bounded by the recess in the glass base structure and the mounting surface of the chip carrier.

10. The semiconductor device of claim 9, wherein the electronic chip is spaced apart from the glass base structure.

11. The semiconductor device of claim 1, wherein the glass base structure is a structure that is at least predominantly made of glass or semiconductor oxide, and wherein the glass or semiconductor oxide extends from inside surface of the glass base structure that faces the planar mounting surface to an outside surface of the glass base structure that faces away from the planar mounting surface.

12. A semiconductor device, comprising
a chip carrier comprising a substantially planar mounting surface;
an electronic chip that comprises an upper main surface with a conductive pad;
a connection body that comprises a glass base structure and an electrically conductive wiring structure,
wherein the connection body is mounted on the chip carrier with the glass base structure facing and adhered to the mounting surface,
wherein an enclosed cavity is disposed between the connection body and the chip carrier,
wherein the electronic chip is disposed within the enclosed cavity,
wherein a conductive track of the electrically conductive wiring structure is disposed directly over the upper main surface and electrically contacts the conductive pad,
wherein the chip carrier is an electrically conductive leadframe.

13. The semiconductor device of claim 12, wherein the electrically conductive wiring structure is completely disposed above the upper main surface of the electronic chip.

14. The semiconductor device of claim 12, wherein the conductive track directly contacts the glass base structure.

15. The semiconductor device of claim 12, wherein the chip carrier comprises a mounting section and a plurality of lead sections that are spaced apart from the mounting section, and wherein the electronic chip is mounted on the mounting section.

16. The semiconductor device of claim 15, wherein the mounting section and the lead sections are monolithic portions of an electrically conductive lead frame.

17. The semiconductor device of claim 12, wherein the glass base structure comprises a recess that extends from a planar outer surface, wherein the planar outer surface of the glass base structure faces and is adhered to the mounting surface of the chip carrier, and wherein the enclosed cavity is bounded by the recess in the glass base structure and the mounting surface of the chip carrier.

18. The semiconductor device of claim 12, wherein the electronic chip is spaced apart from the glass base structure.

19. The semiconductor device of claim 12, wherein the glass base structure is a structure that is at least predominantly made of glass or semiconductor oxide, and wherein the glass or semiconductor oxide extends from inside surface of the glass base structure that faces the planar mounting surface to an outside surface of the glass base structure that faces away from the planar mounting surface.

* * * * *